United States Patent
Titel et al.

(10) Patent No.: US 6,689,222 B2
(45) Date of Patent: Feb. 10, 2004

(54) SEALABLE SURFACE METHOD AND DEVICE

(75) Inventors: Don Titel, Liberty Hill, TX (US); Wayne W. Wheatley, Austin, TX (US); Todd W. Sharpe, Dale, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/188,337

(22) Filed: Jul. 1, 2002

(65) Prior Publication Data

US 2003/0015288 A1 Jan. 23, 2003

Related U.S. Application Data

(63) Continuation-in-part of application No. 09/432,835, filed on Nov. 3, 1999, now Pat. No. 6,481,449.

(51) Int. Cl.$^7$ ............ C23C 16/00; H05H 1/00
(52) U.S. Cl. ............ 118/733; 118/715; 156/345.1
(58) Field of Search ............ 118/733, 715; 156/345.1; 216/83, 100, 102, 103; 134/122 R, 63, 64 R; 427/307, 309

(56) References Cited

U.S. PATENT DOCUMENTS

| | | | |
|---|---|---|---|
| 3,661,660 A | 5/1972 | Wessells et al. ............ 156/14 |
| 4,167,424 A | 9/1979 | Jubenville et al. ............ 134/1 |
| 4,555,302 A | 11/1985 | Urbanik ............ 156/637 |
| 5,091,046 A | 2/1992 | Hunter et al. ............ 156/642 |
| 5,330,558 A | 7/1994 | McCormick et al. ............ 75/715 |
| 5,441,062 A | 8/1995 | Nogues ............ 134/122 R |
| 5,600,081 A | 2/1997 | Simjian ............ 84/453 |
| 5,676,757 A | * 10/1997 | Ikeda et al. ............ 118/733 |
| 5,776,265 A | 7/1998 | Kramer et al. ............ 148/241 |
| 5,863,343 A | 1/1999 | Campbell ............ 134/1 |
| 5,870,526 A | * 2/1999 | Aschner et al. ............ 392/416 |
| 6,002,109 A | * 12/1999 | Johnsgard et al. ............ 219/390 |
| 6,073,576 A | * 6/2000 | Moslehi et al. ............ 118/723 E |

FOREIGN PATENT DOCUMENTS

| | | | |
|---|---|---|---|
| JP | 2-104682 | 4/1990 | ............ C23G/1/12 |
| JP | 002166894 | 6/1990 | |
| JP | 002166895 | 6/1990 | |
| WO | WO 93/11996 | 6/1993 | ............ B63B/59/10 |
| WO | WO 01/32359 A2 | 5/2001 | |
| WO | WO 01/32359 A3 | 5/2001 | ............ C23F/1/36 |

OTHER PUBLICATIONS

PCT Search Report dated May 22, 2001, 8 pages.
Patent application Ser. No. 09/432,835, filed Nov. 3, 1999, Entitled "Ultrasonic Metal Finishing", 16 pages.
Article Entitled "Ultrasonic Deburring" from The International Journal of Advanced Manufacturing Technology, 1997 by S.H. Yeo, et al., 8 pages.
Article Entitled "Ultrasonic Cleaning" by Jeff Hancock, ASM handbook, 5:44–47, 1994, 4 pages.
Article Entitled "The Precision Cleaning of Delicate Structures Using Aggressive Ultrasonics Without Damage" by Russell C. Manchester, from Precision Cleaning, Apr. 1997, 6 pages.

* cited by examiner

Primary Examiner—Parviz Hassanzadeh
(74) Attorney, Agent, or Firm—Moser Patterson & Sheridan; Peter Sgarbossa

(57) ABSTRACT

The present invention provides such an improved metallic surface for sealable mating to a seal device such as a gasket. In one embodiment, it provides a sealable apparatus that has a component and a seal device. The component has a seal contact area for receiving the seal device. The seal contact area comprises a metallic surface with randomly distributed micro-pits that are capable of sealably mating with the seal device when the seal contact area is operably mated to the seal device.

20 Claims, 17 Drawing Sheets

SEALABLE SURFACE METHOD AND DEVICE

CROSS-REFERENCE TO RELATED APPLICATIONS

This is a continuation-in-part of co-pending U.S. patent application Ser. No. 09/432,835, titled ULTRASONIC METAL FINISHING, filed on Nov. 3, 1999, now U.S. Pat. No. 6,481,449 B1 which is hereby incorporated by reference into this specification.

TECHNICAL FIELD OF THE INVENTION

The invention relates generally to the field of sealing and in particular to the discovery of a metal surface finish that is suitable for precision sealing applications.

BACKGROUND OF THE INVENTION

Within numerous manufacturing industries, metal components such as those composed of aluminum can require various finishing processes. For example, in the semiconductor tooling industry, two of these finishing processes for aluminum tools include (1) "jitterbugging" for applying a suitable cosmetic appearance to exposed aluminum surfaces, and (2) polishing for adequately smoothing a surface to provide it with sufficient sealing capability and to reduce its imperfections.

Jitterbugging a surface normally involves manually sanding the surface with vibratory sanding in conjunction with bonded abrasive grain media or fiber pads. This creates a desired dull "matte" finish. In the semiconductor tooling industry, this matte finish has generally become somewhat of an industry standard for exposed aluminum surfaces.

Unfortunately, because the surfaces are processed manually, the required quality of jitterbug finishing is difficult to define, document, or repeat. In addition, excessive human resources are required for jitterbugging the surface of a conventional tool.

Moreover, while the jitterbugged surfaces appear to be cosmetically uniform due to their diffusive appearance, as shown in FIG. 1, a typical surface without any additional polishing will include lengthy, continuous traces resulting from the use of abrasive materials. These lengthy traces (or scratches) tend to impair the surface's sealing capability. Thus, polishing is applied to portions of surfaces that require sealing capability.

Unfortunately, polishing metal surfaces in order to improve their sealing capability also involves significant manual effort and resources. In addition, traditional polishing processes are not always effective for attaining necessary sealing capabilities. Moreover, some surfaces have complicated or intricate geometries that are not even amenable to conventional polishing.

Accordingly, a need exists for an improved scheme for acquiring metal surfaces that are suitable for sealing applications.

SUMMARY OF THE INVENTION

The present invention provides such an improved metallic surface for sealable mating to a seal device such as a gasket. In one embodiment, it provides a sealable apparatus that has a component and a seal device. The component has a seal contact area for receiving the seal device. The seal contact area comprises a metallic surface with randomly distributed micro-pits that are capable of sealably mating with the seal device when the seal contact area is operably mated to the seal device.

In another embodiment, it provides a sealable apparatus that includes a seal device, a first component, and a second component. The seal device has first and second sealing surface regions. The first component has a seal contact area for receiving the seal device at the first sealing surface region. Likewise, the second component has a seal contact area for receiving the seal device at the second sealing surface region. The second component's seal contact area comprises a metallic surface with randomly distributed micro-pits thereby making it capable of sealably mating with the second sealing surface region. The first and second components seal to one another when the first and second contact areas are operably mated to the seal device at its first and second sealing surface regions.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
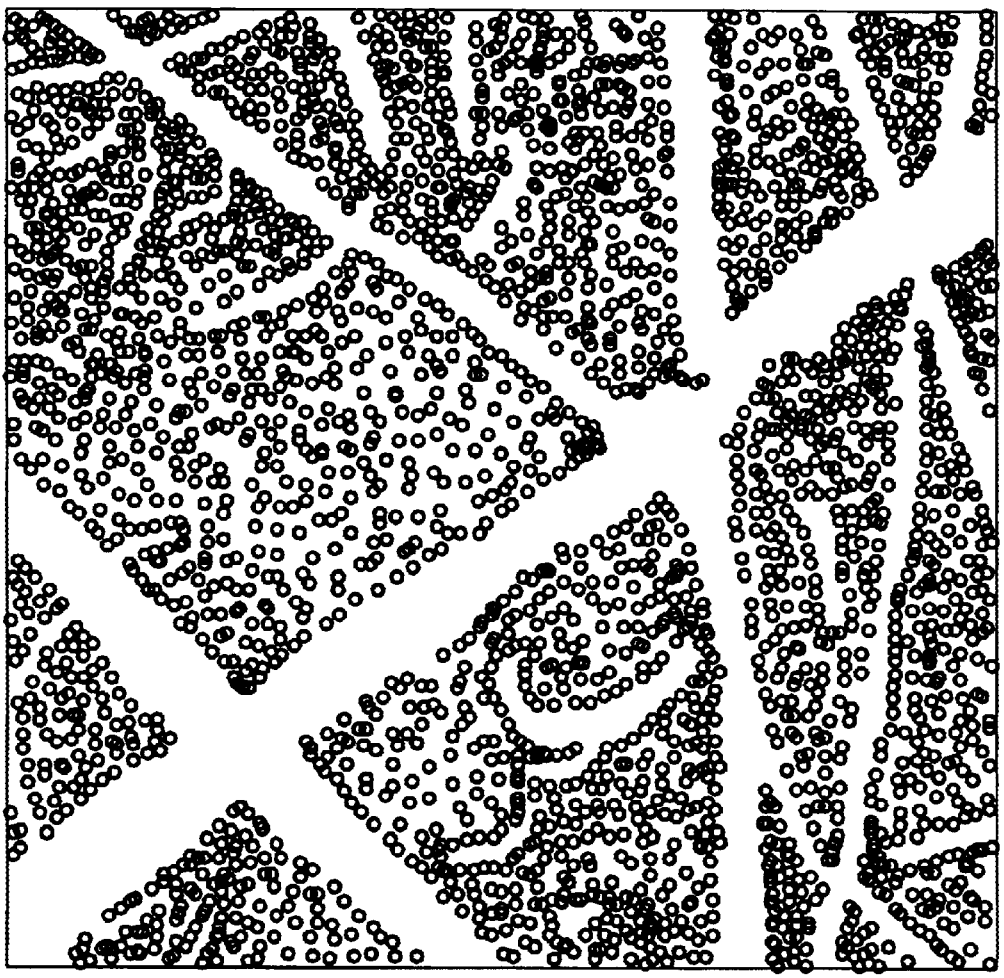
FIG. 1 shows magnified aluminum surfaces after having been finished pursuant to a prior art Jitterbug process.

It has been discovered that metal articles—even articles with relatively high roughness averages ("Ra"), e.g., up to 300 micro inches—but with randomly distributed micro pitted surfaces can be suitable for sealing applications without the need for additional smoothing or polishing. It is believed that because micro-pits have relatively smooth rather than jagged sloping contours, it is much easier for gaskets and sealing rings to conform within and about them. In addition, because of these smoother contours, micro-pits trap less gas and thereby result in lower virtual leaking. Also, with randomly distributed pits (as opposed to geometrically aligned indentions or lengthy scratches), micro pits generally do not form pathways that are capable of traversing seal contact areas such as across sealing contact patches. For example, depending on the width of a seal contact area and the size of the micro pits, it may take 50 to 1000 micro pits to cross a sealing contact patch. Therefore, it would require a significant number of micro pits in perfect alignment to produce a leak pathway. That is, the induced micro pit "errors" are so small that they in essence become insignificant. However, they are effective for creating a sealable surface—apparently by averaging out the roughness and smoothing sharp edges within surface defects.

Ultrasonic Finishing Process

One way of achieving a randomly distributed micro-pitted finish involves cavitationally eroding and chemically corroding a metal article within a finishing bath. The corrosion can be enhanced with ultrasonic cavitation of the chemical solution within the finishing bath. Micro pits are initially formed in the exposed passivation layer about the surface of the article. The pits are then enlarged and/or smoothed through chemical corrosion. In a preferred embodiment, the corrosion and cavitation occur simultaneously.

In general, metal surfaces are covered with a thin layer of natural oxides through a process typically termed as natural passivation. For example, with Aluminum and its alloys, this passivation layer is typically composed of hydroxide and oxide, which can be fairly inert in alkaline (e.g., weak alkaline) environments. For example, aluminum typically has a thin (e.g., about 10 nm) oxide layer on its surface whenever it has been exposed to the atmosphere. This passivation layer, which is mainly composed of $AL_2O_3$, prevents further oxidation of the underlying bulk aluminum.

In one ultrasonic finishing process, a metal article to be finished is placed in a finishing solution in the presence of an ultrasonic field with sufficient energy levels for adequate cavitation. It is believed that the cavitation creates micro pits that penetrate through the passivation layer to the underlying substrate (metal surface). Once pits are created and substrate portions are exposed, corrosion of the underlying metal proceeds with chemical reaction(s) between exposed metal and a corroding chemical such as a caustic or alkaline solution. The pits are enlarged and/or smoothed with the continuation of corrosion reaction. This cavitation/enhanced corrosion finishing process creates the desired micro-pitted finish. Because the pits are randomly distributed over the surface of the article, a sufficiently homogeneously "smooth" surface results with favorable porosity and sealing characteristics.

Cavitation

The formation of micro pits in the external (e.g., passivation layer) surface is achieved by cavitation erosion with the use of ultrasonic energy. Cavitation is the formation and collapse of bubble-like voids or vapor bubbles in a liquid subjected to rapid pressure changes, which are created with activation of ultrasonic waves. The bubbles are created at sites of rarefaction as liquid fractures or tears because of the negative pressure of the ultrasound wave traveling in the liquid. When cavities implode immediately on the solid passivation surface or at least in their close proximity, erosion of the surface occurs.

The efficiency of cavitation can be enhanced in various manners. Higher power density waves provide stronger shock waves for the generation of high speed jets (e.g., 100 m/s), which create the micro pits in the passivation surface. In addition, the use of higher frequency waves leads to a higher threshold for cavitation. As a consequence, it requires more energy to produce cavities of similar sizes. Degassing the liquid decreases the threshold by limiting excessive solution of gas, which otherwise would diffuse into the cavitation bubbles and retard rapid collapsing of cavities. This further accelerates the cavitational erosion process. Other parameters besides power density and frequency that affect the efficiency of cavitation include: finishing solution temperature (viscosity and surface tension, of finishing solution) and surface morphology/roughness prior to processing.

Because a random cavitation distribution over the article's outer surface is desirable, frequency sweeping of the generated ultrasonic field may be employed to avoid the problems created with standing waves in a finishing tank. In addition, when finishing articles with difficult geometries, the ultrasonic wave source's position and/or that of the article and wave-source relative to one another may be modified in order to achieve acceptable uniformity.

Corrosion

The corrosion process will briefly be described with aluminum as the metal article and the use of a caustic, albeit diluted, alkaline solution as the chemical corrosive; however, skilled artisans will recognize that the same fundamental principles would apply for other metals and other corrosives with similar chemical relationships to one another. Initially, $OH^-$ is adsorbed at the exposed (penetrated) ALUMINUM surfaces. Aluminate (i.e., $AL+4OH^-$, which results in $AL(OH)_4^- + 3e^-$) is then formed. This may be the slowest part of the whole chemical reaction.

The corrosion process (and thus ultimately the finishing process itself) is affected and may be enhanced by optimizing (as a matter of taste for a given application) the following factors: pH level of corrosive (e.g., of alkaline solution), chemical composition of corrosive solution (accounting for enhancing additives, as well as contaminant inclusions or particles); temperature; and processing time. Specifically, the process may be enhanced by (1) substantially maintaining the pH of the finishing solution and/or the molarity concentration of the corrosive material at desired levels, (2) removing reaction product while corrosion is occurring, and (3) corroding the metal substrate in an ultrasonically energized environment (e.g., during ultrasonic cavitation with the finishing solution functioning as both the cavitation median and the chemical corrosive).

Corroding the metal while being subjected to ultrasonic energy enhances the corrosion process for several reasons. Ultrasonic cavitation facilitates the generation of fresh aluminum surface permitting the chemical reaction to expand. In addition, ultrasonic cavitation provides thermal energy, which accelerates the chemical reaction and may even change the reaction path. Furthermore, ultrasonic cavitation circulates the liquid so as to achieve a uniform chemical reaction. Finally, along with the ultrasonic cavitation and implosion that happens at close proximity to the surface resulting in noticeable material removal, there are implosions near the surface and throughout the liquid. These disturbances effectively substitute "fresh" (more chemically active) finishing solution for solution that is saturated with chemical reactant products and is relatively depleted of chemical agents for reacting with the aluminum. This allows the more chemically active solution to come into contact with the aluminum surface so as to permit the chemical reaction to continue until the chemical corrosion solution (e.g., finishing solution) is evenly saturated everywhere. This is especially beneficial when irregular surfaces or internal passageways are to be finished.

Ultrasonic Finishing Apparatus

Figure 2:
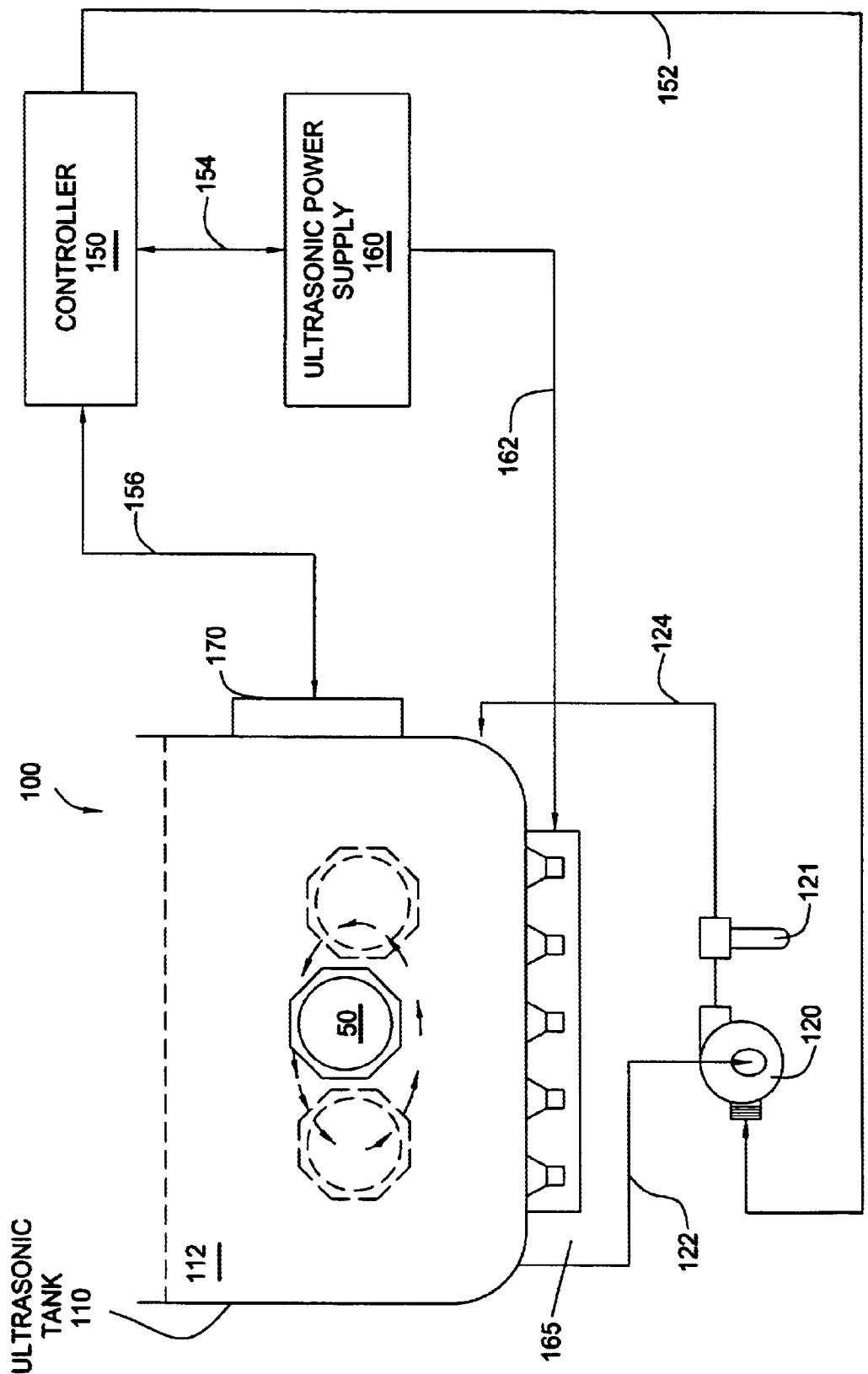
FIG. 2 shows a block diagram of one embodiment of an apparatus for finishing a metal article pursuant to the present invention.

FIG. 2 shows an apparatus 100 for finishing a metal article 50 (e.g., an aluminum tool) with a process of the present invention. The apparatus 100 includes tank 110, which contains finishing solution 112 that, in the depicted embodiment, is chemically corrosive and also serves as the cavitation liquid. Also included is recirculation pump 120, controller 150, ultrasonic power supply 160, ultrasonic transducers (e.g., bonded, immersible) 165, and environmental control module 170.

Recirculation pump 120 is fluidly connected in a closed loop configuration to tank 110 via tank outflow and inflow lines 122, 124, respectively. The ultrasonic power supply 160 is electrically connected to ultrasonic transducers 165, which are operably mounted to tank 110 for generating ultrasonic waves within the finishing solution 112. Likewise, environmental control module 170 is also operably mounted to tank 110 for controlling various environmental parameters (e.g., temperature, fluid level, chemical pH) of finishing solution 112. Controller 150 is communicatively connected to recirculation pump 120, ultrasonic power supply 160, and environmental control module 170 via communication links 152, 154, and 156, respectively.

The ultrasonic power supply 160 generates an electrical signal having a controllably adjustable frequency, responsive to controller 150, for ultrasonically driving the ultrasonic transducers 165. The environmental control module includes appropriate sensors, transducers, and/or other devices for controlling, responsive to controller 150, relevant environmental parameters within finishing solution 112. Finally, responsive to control from controller 150, recirculation pump 120 re-circulates finishing solution 112 through a filter 121 for filtering the finishing solution in order to controllably limit the accumulation of particulate matter such as abrasive particles.

The components for implementing apparatus 100 may be derived from any suitable sources and are conventionally known to persons having ordinary skill in the art. Likewise, the finishing solution 112 may be any solution that promotes adequate cavitation in connection with an apparatus 100. As known in the art, almost any liquid will meet this requirement. In one embodiment, finishing solution 112 includes the chemical corrosive for chemically corroding the metal as the article is being subjected to cavitation. For example, with aluminum as the article, an alkaline solution could be used as the finishing solution. One example of a suitable, corrosive finishing solution is diluted commercially available alkaline cleaner. In one embodiment, the finishing bath (diluted cleaner) solution comprises about 5% by volume alkaline cleaner and about 95% by volume water. In one embodiment, the alkaline cleaner has a pH value in the range of between 13 and 13.5, and it comprises about 95% potassium hydroxide and about 5% surfactants and anti-foaming agents. Examples of suitable commercially available alkaline cleaners are Al-Tex 101™ and Al-Tex 102™, available from ACS Products of Plainville, Mass. Al-Tex 101™ is an alkaline cleaner concentrate with a pH value in the range of about 13 to 13.5. The composition of Al-Tex 101™, in percentage proportions by weight, is as follows: De-ionized water (65%), Potassium Hydroxide (25%), Sodium Gluconate (4%), NTA Chelator [Nitrilo-Tri-Acetic Acid] (1%), Pluronic® L-62LF [surfactant] (1%), and Triton® H-66 [stabilizing agent] (4%). Al-Tex 102™ is essentially the same except that it includes an additional, conventional anti-foaming agent.

When the finishing solution includes the chemical corrosive, selection of the particular finishing solution composition should be guided by the selectivity between the passivation layer and metal substrate when the metal article has a passivation layer. The chemical should be relatively more aggressive for substrate than for passivation layer. In addition, additives can be formulated to enhance the ability for removing contaminant inclusions (e.g., silicon, iron), which can remain in the finished metal surface.

In the depicted embodiment, controller 150 controls the overall operation of apparatus 100 in accordance with instructions from a user. The controller 150 is programmed (or adjusted) so that the apparatus 100 finishes the metal article 50 according to a particularly desired finishing process. Controller 150 controls the operation of recirculation pump 120 to adjust or maintain the concentration of particulate matter (which may be created pursuant to the finishing process) in the finishing solution 112. In addition, controller 150 through environmental control module 170 controls various finishing solution 112 parameters including temperature, chemical pH level, and volume. Controller 150 also controls ultrasonic power supply 160 for generating ultrasonic waves within the finishing solution 112. The generated wave frequency may be adjusted or even continuously varied such as by sweeping the generated frequency over a preselected frequency range. In this manner, controller 150 controls the various relevant processing factors such as ultrasonic wave characteristics, timing, and the physical and chemical properties of the finishing solution 112 in order to carry out the finishing process.

It should be noted that although the above description primarily describes the treatment of aluminum articles, the process can be applicable to a wide range of metals and other materials.

Related Example

Figure 3A:
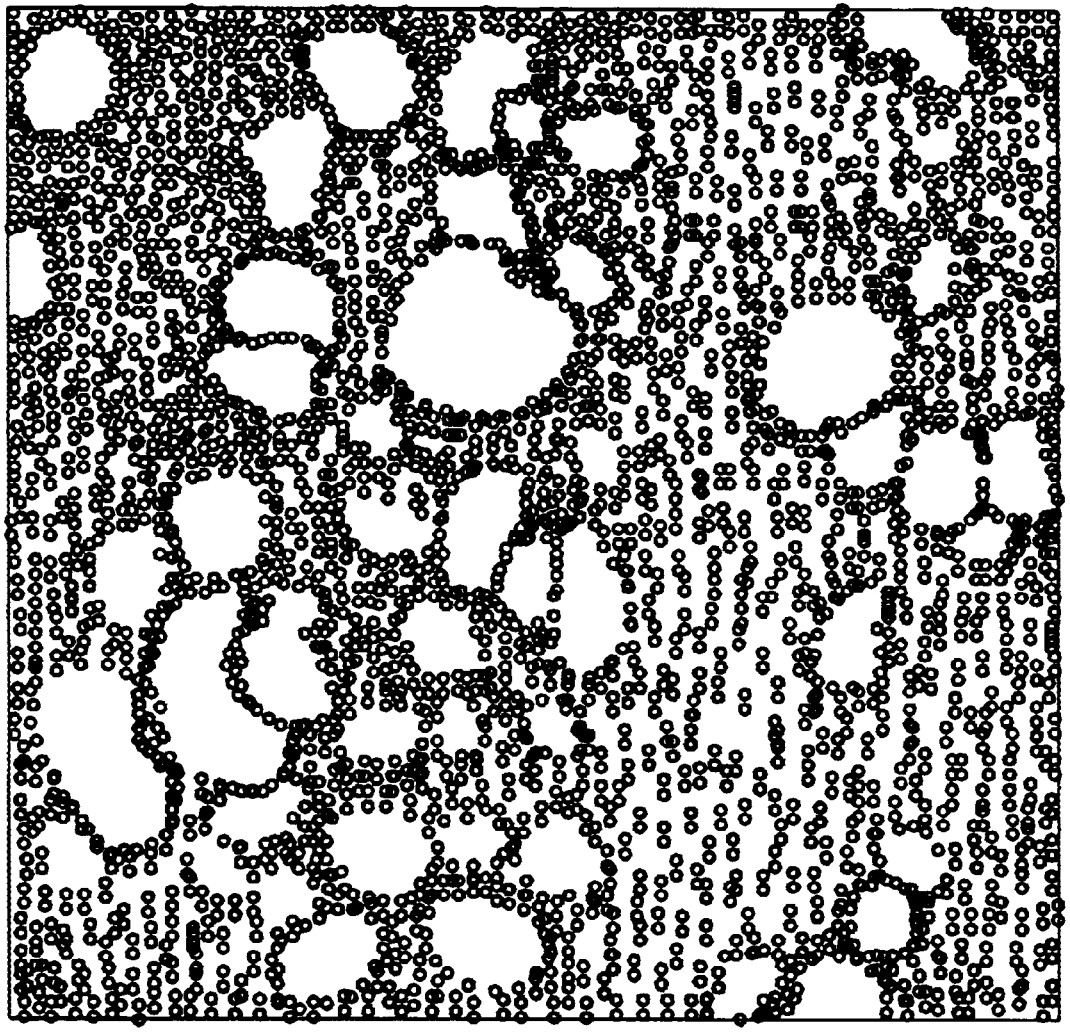
FIGS. 3A–3C show magnified views of aluminum surfaces after having been finished pursuant to one embodiment of the present invention.
Figure 3B:
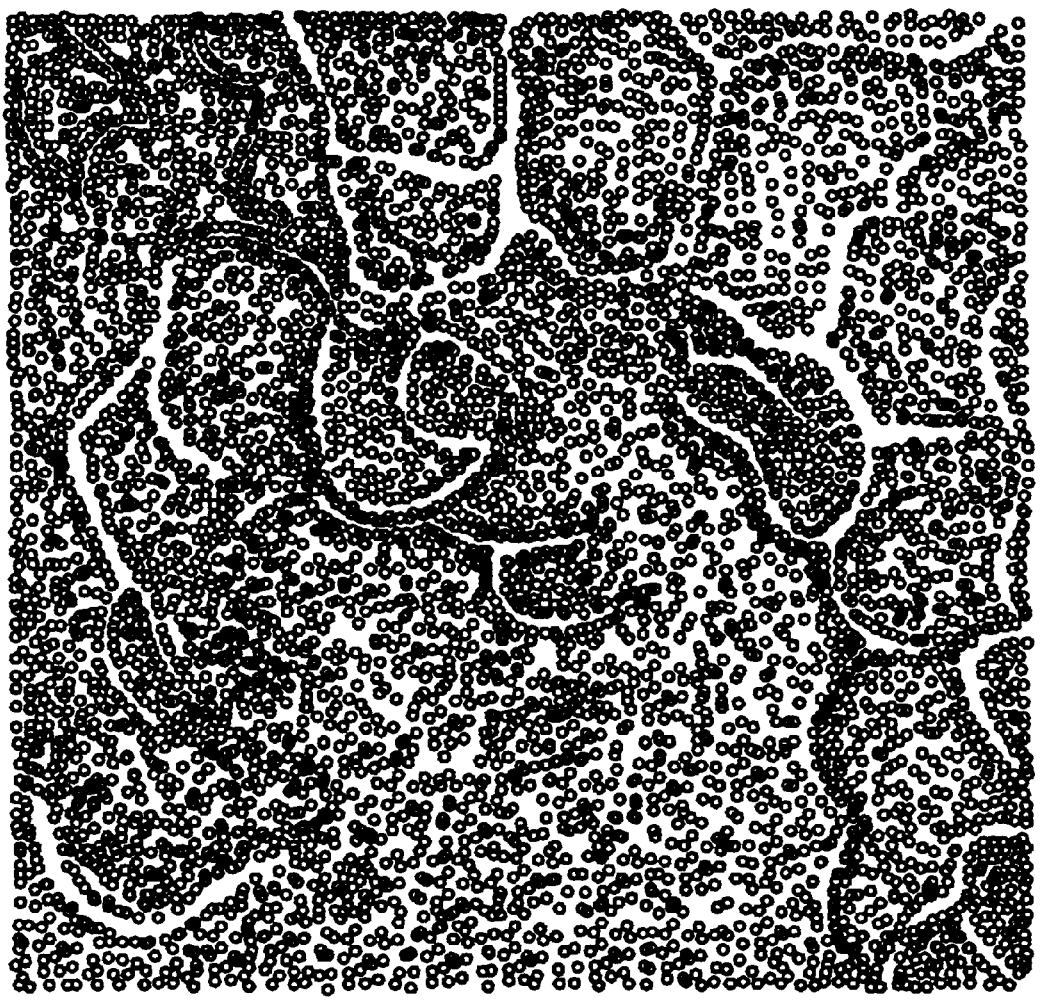
Figure 3C:
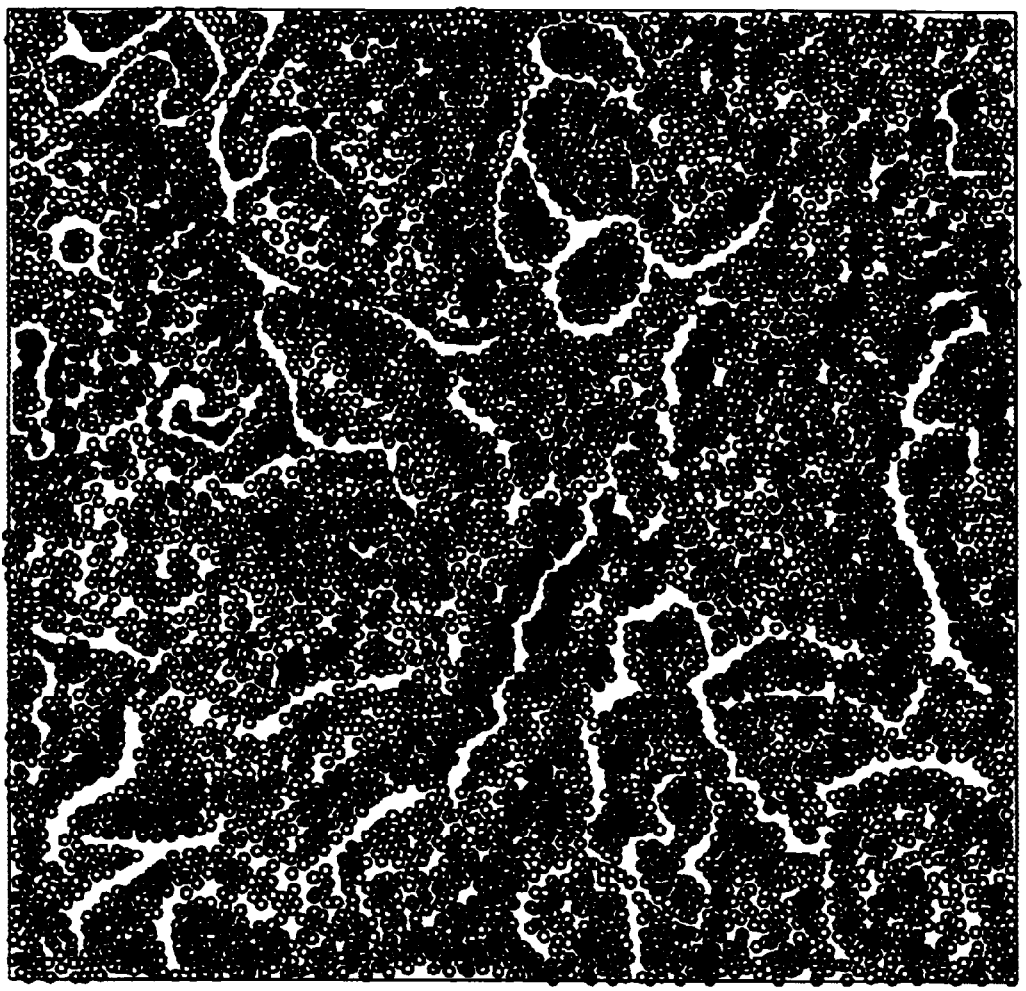

FIGS. 3A–3C show magnified views of a number of 11.5" by 5" by 0.75" aluminum plates that were machined from commercial grade 6061 T6 Al alloy. Each batch of plates was processed in an ultrasonic tank of finishing solution composed of diluted, commercially available Al-Tex 101™ alkaline cleaner at temperatures of between 60° C. to 80° C. The bath was subjected to an ultrasonic field with a frequency in the range of 23 to 27 kHz and a power density in a range of between 100–120 watts-per gal. Typically, it took about thirty minutes to achieve a diffusive or matte appearance. After processing, all Aluminum plates were rinsed to clean off the finishing solution. The three batches of Aluminum plates (as shown in FIGS. 3A, 3B, and 3C) were processed under slightly different conditions due mainly to different processing times and the use of finishing solutions with slightly different levels of alkalinity.

Surface morphology differences were observed in the three batches, as shown in FIGS. 3A through 3C. Depending on the finishing bath alkalinity (as well as on the other processing parameters) pit number, size, and consistency varies from one batch to another. For plates processed in the first batch (FIG. 3A) in a weaker alkaline solution, the surfaces exhibited smaller diameter pits with stepped grain boundaries. For plates processed in the second batch (FIG. 3B), the surfaces exhibited overlapping pits of various diameters. In addition, it appears that smaller pits were produced at the surfaces of larger pits previously produced. Finally, for plates processed in the third batch (FIG. 3C) in the strongest alkaline solution, the surfaces exhibited similar distributions of pits and small portion of surfaces without any pits. On a sufficiently macroscopic level, these overlapping pits are homogeneous enough to not only create the desired matte finish, but also, to create a suitably sealable surface.

Sealable Surface

Figure 4A:
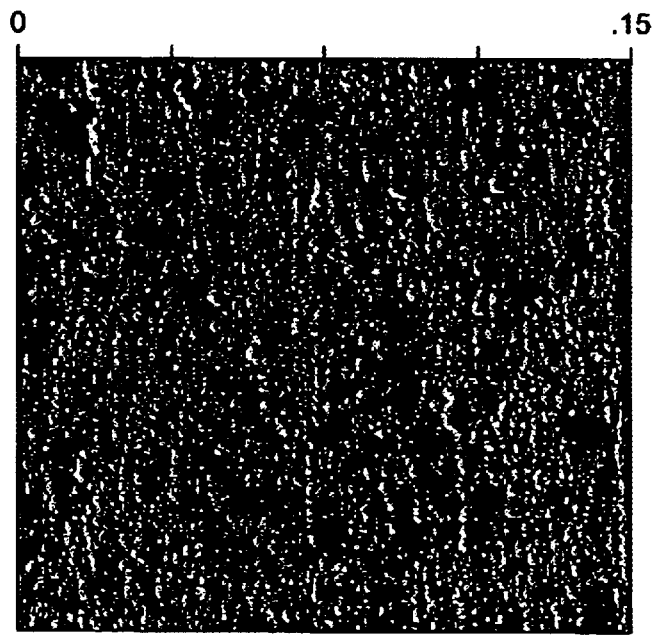
FIG. 4A shows a 100×magnified view of the surface of a sealable article that has been finished with a process to impart within it randomly distributed micro-pits.
Figure 4B:
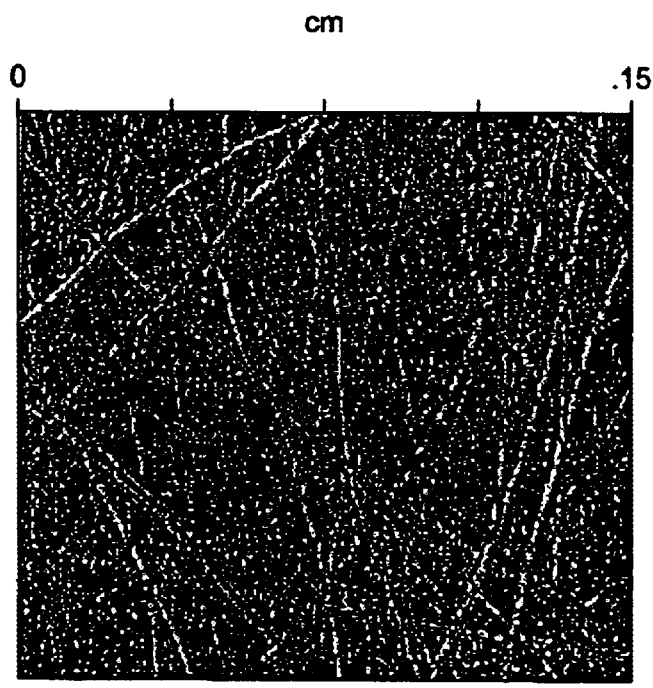
FIG. 4B shows a 100×magnified view of the surface of a non sealable article that has been finished with a conventional, jitterbug finishing process.

An improved surface for sealing applications has been discovered. In one embodiment, randomly distributed micro pits are imparted within the external surface of a metal article. Such a surface is depicted in FIG. 4A and is contrasted against a conventional, jitterbug finished surface, which is shown in FIG. 4B. It can be seen that the jitterbugged surface of FIG. 4B has relatively lengthy scratches and abrasions, which can provide leak pathways from one side of a seal zone to the other. They also have jagged cross-sections, which inhibit sealing devices such as O-rings and gaskets from operably conforming within their spaces. They also cause increased gas absorption resulting in more problematic virtual leaking. In contrast, the micro-pitted surface of FIG. 4A has randomly distributed micro-pits that effectively remove such scratches (whether from jitterbug or machine processes) without providing continuous leakage paths across a sealing zone. In addition, their cross-sections have less abrupt contours thereby allowing sealing devices (e.g., gaskets, O-rings) to more easily conform within their spaces. They also absorb less gas than conventionally finished surfaces.

Figure 5:
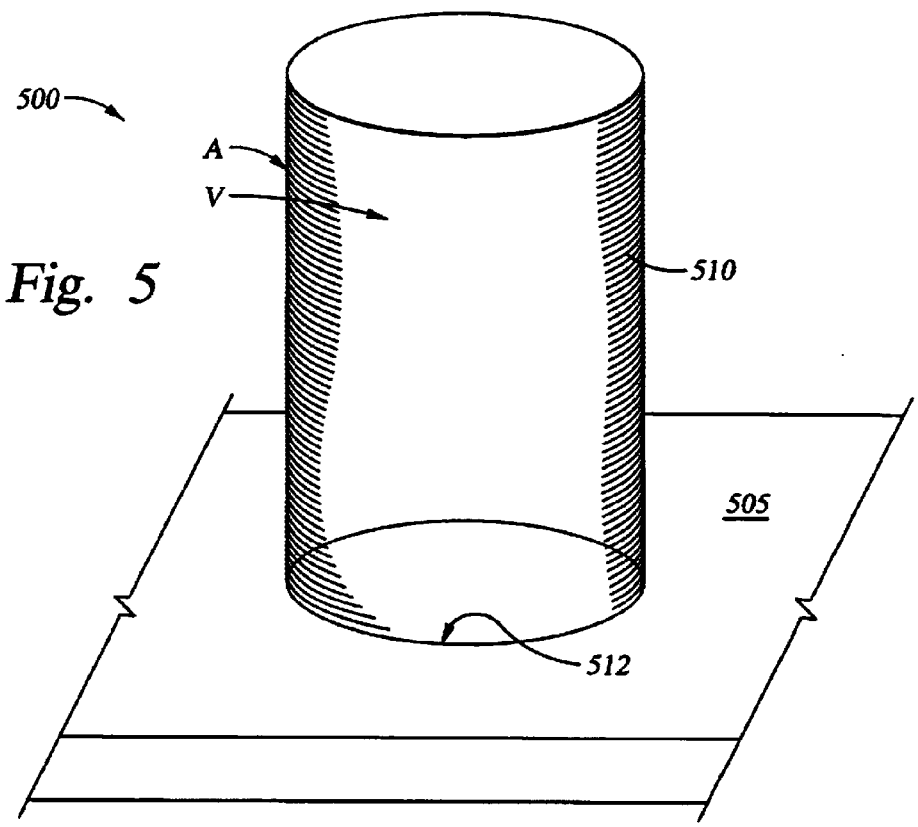
FIG. 5 shows a perspective view of an exemplary vacuum chamber with a seal that is made according to the present invention.

FIG. 5 depicts a generic vacuum chamber 500—shown for describing some of the aspects of the present invention. Vacuum chamber 500 comprises a metal article base 505 and a chamber housing 510 sealably connected to the article 505 at seal 512. The depicted seal generally includes a channel (or groove) with an O-ring (not shown) for sealably coupling the chamber housing 510 to the article base 505. When gas is pumped out of the interior of the chamber (i.e., with suction apparatus not depicted), a vacuum space V is generated. This is in contrast to the ambient environment, A, outside of the chamber. It should be recognized that the depicted chamber apparatus 500 is used for describing one example of a sealing application, e.g., to form a vacuum chamber work-space for working on a semiconductor wafer. However, the present invention applies to any sealing application, including but not limited to vacuum chamber applications, where a metal surface is mated with another object through a seal device such as a gasket or an O-ring.

Figure 6A:
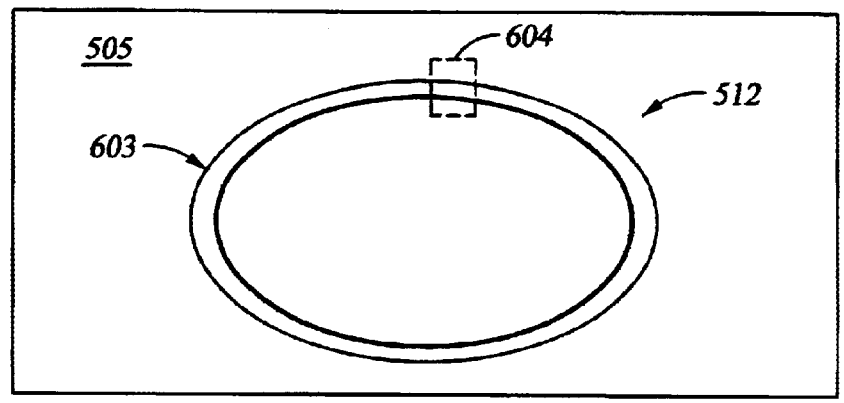
FIGS. 6A through 6D show different portions of the seal of FIG. 5 from different perspectives with and without an inserted O-ring.
Figure 6B:
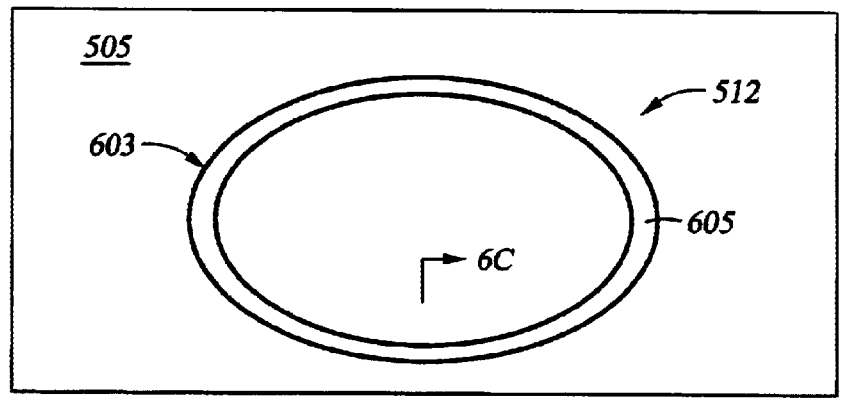

FIGS. 6A through 6D show various portions of seal 512 in greater detail and from different perspectives with and without an inserted O-ring. FIG. 6A shows a top view of the metal article base 505 without an O-ring inserted within groove 603. FIG. 6B shows the same view of groove 603 but with an O-ring 605 inserted there within. O-ring 605 could be any conventional O-ring suitable for a given application. In the depicted embodiment, the O-ring is a round cross-sectioned Viton™ 75 durometer O-ring.

Figure 6C:
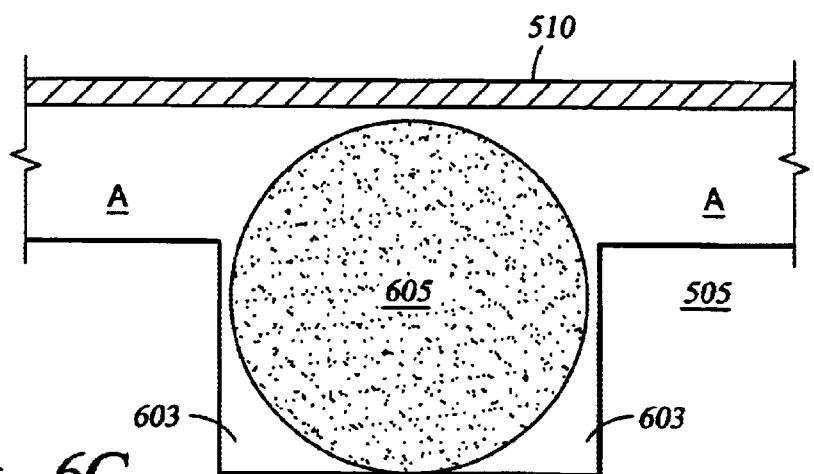

FIG. 6C shows a cross sectional view of the O-ring 605 from FIG. 6B but with the chamber housing 510 mounted atop it; although in the drawing, chamber 510 has not yet been operably compressed to base 505. In addition, gas within the chamber has not yet been evacuated as is connoted by the reference, A, in both the left (chamber) and right (ambient environment) sides of O-ring 605.

Figure 6D:
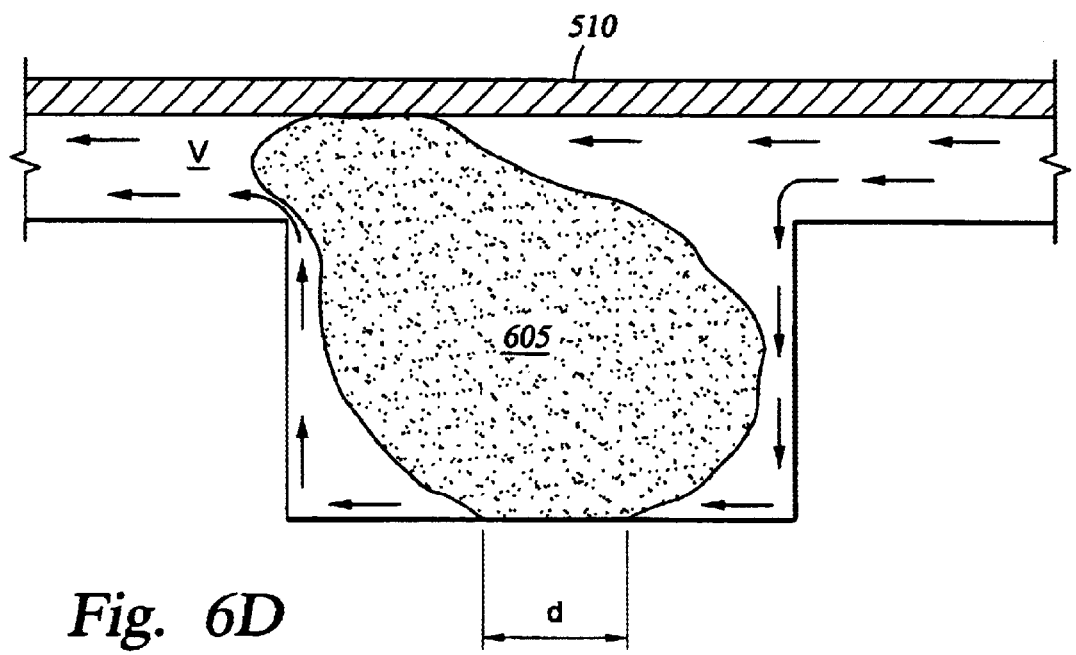

FIG. 6D shows a cross-sectional view of FIG. 6C but with the gas evacuated within the chamber, as is connoted by the V in the chamber side of gasket 605. The depicted arrows generally show the gas leakage pathway(s) through the metal base groove 505 and beneath chamber housing 510. (It should be pointed out that the chamber piece 510 is not shown fixed "tightly" against base piece 505, even though it would be so fixed if actually operably mounted. It is depicted this way in order to more easily convey the relevant seal leakage pathways indicated by the arrows.) As is shown in the figure, the O-ring deforms toward the lower-pressure, vacuum chamber side of the groove 603.

There is a contact distance "d" that corresponds to the distance that a sealing device such as an O-ring operably conforms against a sealing contact area. For simplicity, in FIG. 6D, d is depicted only for the distance that O-ring 605 is in contact across the bottom of groove 603. For the O-ring to sufficiently operate, in cooperation with the contact portion of the groove, it should be able to inhibit the flow of gas through this contact area under expected operating vacuum conditions. Thus, as will be addressed herein, the contact area of the groove should not have excessively long scratches or continuously-aligned defects (e.g., indentions, crevices) that are sufficiently sharp or deep enough to convey gas from one side of a contact area to its other side without being inhibited by the seal device (e.g., O-ring). (Of course, these constraints would apply for all sealing contact areas, such as the portion of the housing chamber bottom, that operably contact a sealing device and are relied on to inhibit leaking.)

Figure 7A:
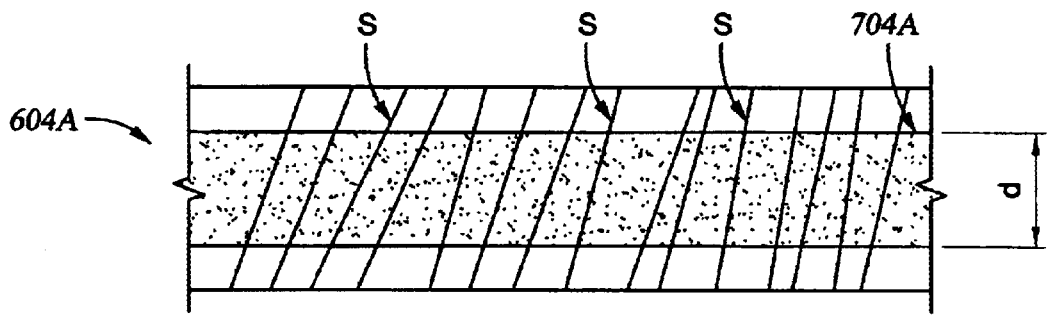
FIGS. 7A and 7B diagrammatically show views of the groove depicted in FIG. 6A with different surface finishes.
Figure 7B:
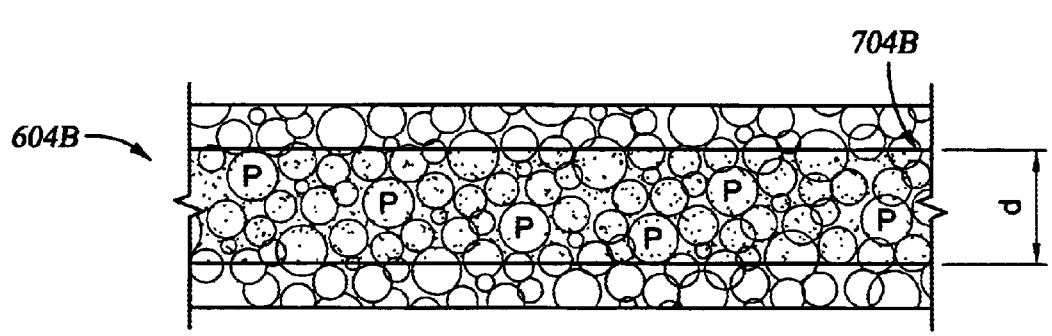

FIGS. 7A and 7B diagrammatically show views (not-to-scale) of the groove bottom 604 referenced by the dashed box in FIG. 6A. FIG. 7A represents a groove finished with a conventional, mechanical finishing process thereby resulting with scratches "S", while FIG. 7B represents a groove finished with a process that results with uniformly distributed micro-pits P, which are depicted as circles. (The micro-pit circles, P, are not necessarily shown to scale with respect to the contact zone width d. They will generally be smaller in actual practice.) Each figure shows the seal contact zone 704 with the contact distance, d. The depicted seal contact areas 704A and 704B are superimposed across the groove bottoms in order to illustrate where the O-ring would be in operable contact with the groove. In this way, sealing differences between mechanically finished surfaces, which have scratches, S, and surfaces that are finished to have uniformly distributed micro-pits can be readily conveyed. It can be seen that the scratches, S, will provide a continuous path for gas to leak across (or beneath) the O-ring. Conversely, the micro-pits are not large enough nor are sufficiently aligned to provide such a path. It is believed that this is one of the reasons that a metal article finished to have a randomly pitted surface may be acceptable for sealing without the need for additional polishing and in most cases, will be better suited for sealing than mechanically finished surfaces with scratches and/or continually aligned surface anomalies (e.g., pits, scratches, protrusions). Another possible reason why pitted, versus scratched surfaces, are better for sealing will be addressed in the following section.

Figure 8A:
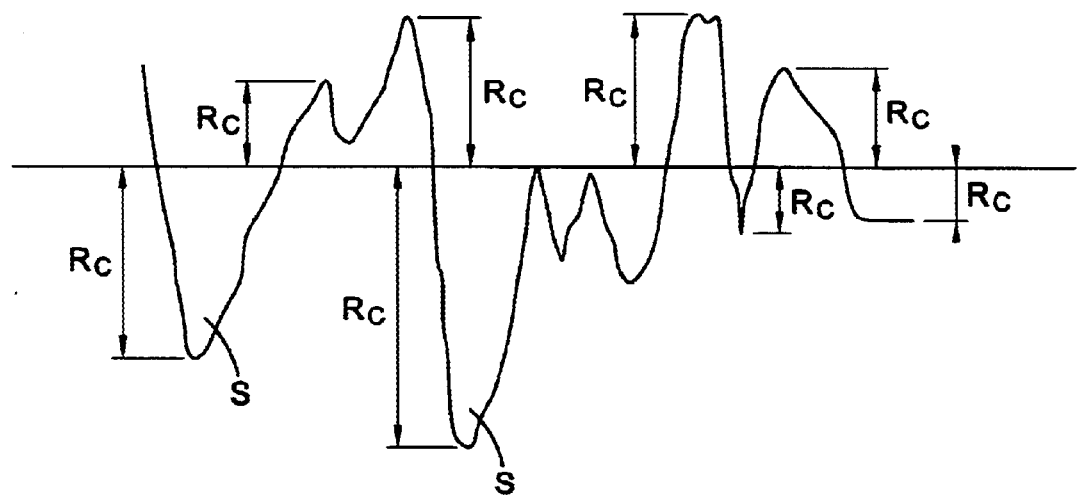
FIGS. 8A and 8B are enlarged, diagrammatic cross-sectional views showing surface textures for mechanical (e.g., jitterbug) and random micro-pitted surface finishes.
Figure 8B:
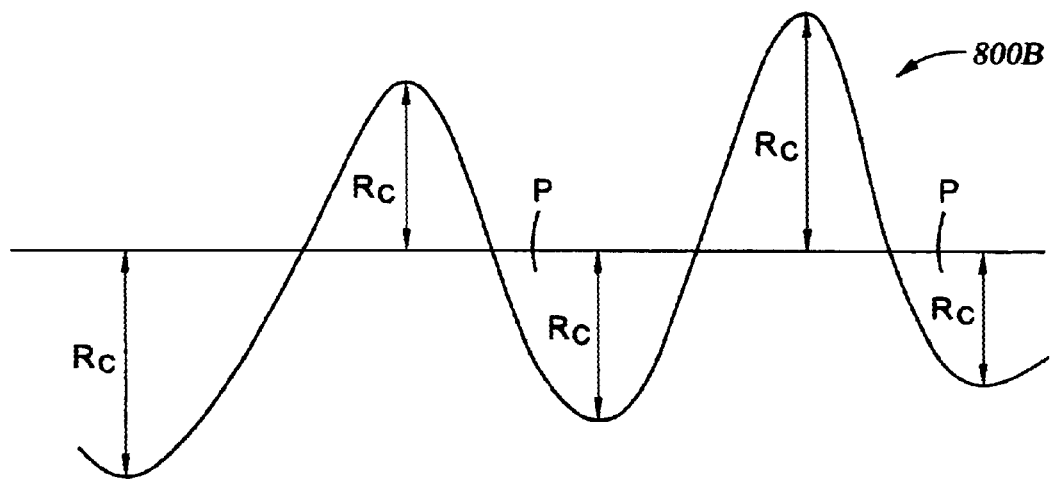

FIGS. 8A and 8B are magnified, diagrammatic cross-sectional views of surface textures for mechanically finished (e.g., jitterbug) and random micro-pitted surfaces, respectively. As with the drawings of FIG. 7, these diagrams are not necessarily drawn to scale; their purpose is to show their roughness average measures in connection with their cross-sectional contours. The arrows marked "$R_c$" connote the individual roughness components for protruded and recessed anomalies. The mean average of the sum of the absolute values of these components constitutes their roughness averages. As can be seen, even though the pitted surface of FIG. 7B would have a higher roughness average, the scratches have much sharper contours (or slopes). It is believed that recessed anomalies (e.g., scratches) with sharper contours not only retain more gas, which causes increased virtual leaking, but also, prevent sealing devices (e.g., gaskets, O-rings) from effectively conforming within their spaces. This latter difference is illustrated in FIGS. 9A and 9B.

Figure 9A:
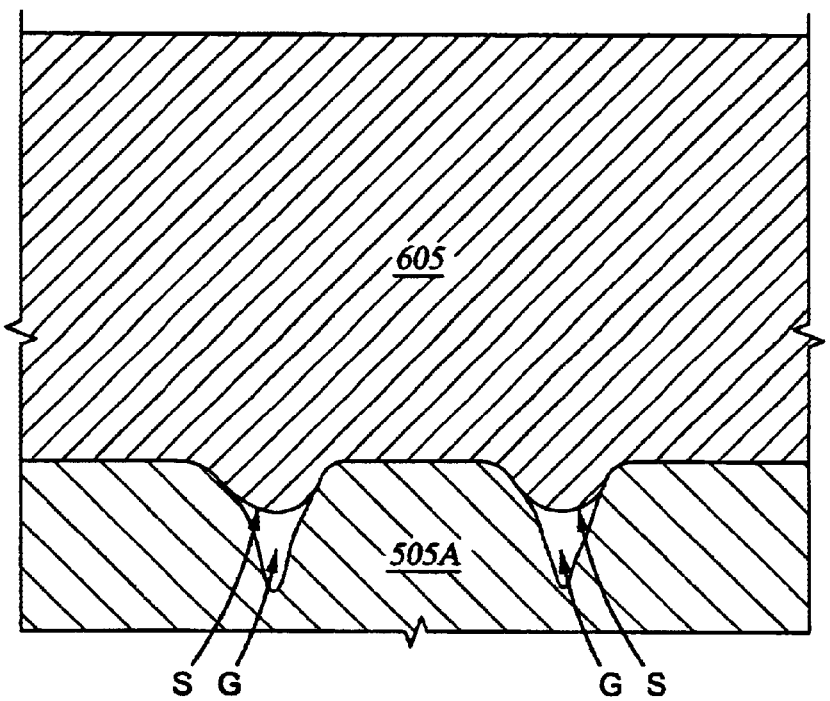
FIGS. 9A and 9B diagrammatically show cross-sectional views of the mechanically finished and micro-pitted surfaces with inserted O-rings.
Figure 9B:
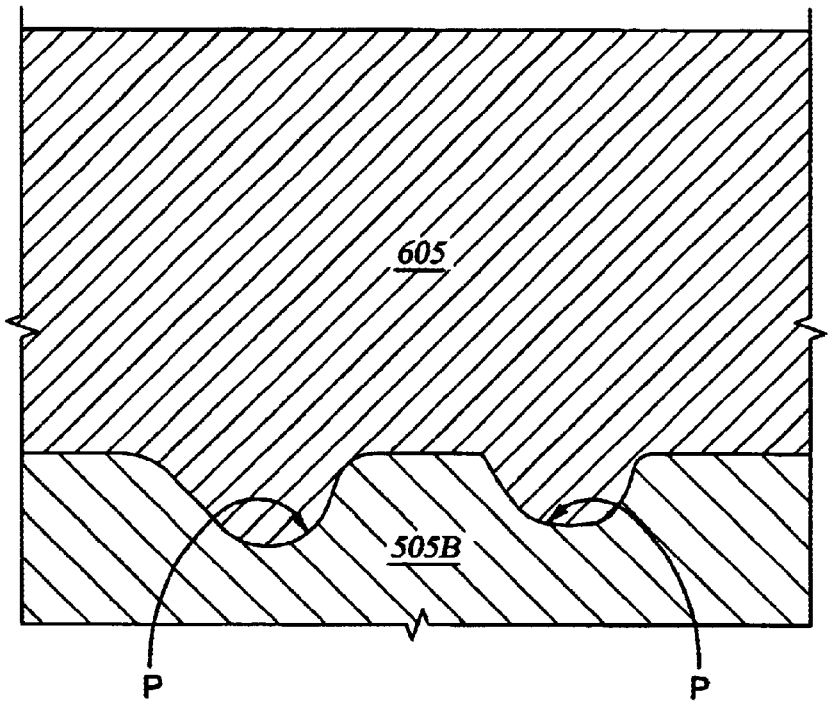

FIGS. 9A and 9B diagrammatically show cross-sectional views of the mechanically finished and micro-pitted surfaces, respectively, with inserted O-rings 605. As is seen in FIG. 9A, the O-ring is unable to completely conform within the scratch, S, gaps. This results in gap voids, G, remaining, which allows gas to pass through the scratches beneath the O-ring. In contrast, the O-ring sufficiently molds within the pit recesses, P, as is shown in FIG. 9B.

Additional Examples

EXAMPLE 1

An Ultrasonic finishing ("UF") process of the present invention is used for finishing aluminum surfaces, which react with a chemical bath. In this example, the bath contained about 5% Al-Tex 102 alkaline corrosive and 95% water. The ultrasonic finishing process used in this example generally included four steps: (1) pre-clean to degrease the part surface, (2) ultrasonic finishing for 30 min with 25 kHz ultrasonic wave, at 50 to 60° C., (3) De-smut with a clean/neutralizing bath, e.g., with Citranox®, for 1–5 min, with 40 kHz ultrasonic wave, at room temperature, and (4) rinse with di-water and dry. If required, e.g., for a process vacuum chamber operation in a semiconductor manufacturing application, a conventional ultra high vacuum ("UHV") cleaning may also be performed. However, it should be pointed out that such a cleaning is not necessary to achieve a sealable surface.

The main reaction during a UF process is that Aluminum reacts with potassium hydroxide (the major component of the Al-Tex 102 corrosive) to form a soluble complex Al($OH)_4^-$ as follows:

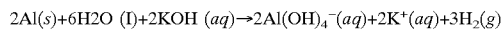
$2Al(s)+6H2O\ (l)+2KOH\ (aq)\rightarrow 2Al(OH)_4^-(aq)+2K^+(aq)+3H_2(g)$ This reaction etches away about 0.00025 inch or 6.35 μm of aluminum surface within 30 minutes and generates hydrogen bubbles. The complex can form aluminum hydroxide precipitate when potassium hydroxide concentration becomes low through the following reversible reaction:

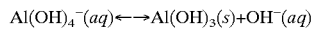
$Al(OH)_4^-(aq)\leftrightarrow Al(OH)_3(s)+OH^-(aq)$

However, some additives (conventional surfactants) are added in Al-Tex 102 to inhibit formation of precipitate.

In this example, titration, etch rate, and surface morphology analysis of test coupons were used to examine the chemical bath. The effects of Al-Tex concentration on etch rate and surface morphology were found and were used to determine the chemical bath lifetime. Finally, methods to determine chemical bath lifetime were recommended.

This UF experiment was conducted continuously with h+ of an aluminum loadlock (67.2 lb) put into a 110-gallon tank. The heavy loading and continuous process were to ensure that the chemical bath could be consumed in a short period of time. The bath temperature was set at 130° F., and the actual temperature ranged between 130–140° F. The ultrasonic frequency was 25 kHz. At different stages of the chemical bath, 300 milliliter (mL) of bath sample was obtained for titration, and two test coupons (aluminum 6061 sheets) with big surface areas (4 in×4 in×0.09 in) were UF processed.

The corrosive (Al-Tex) concentration in the chemical bath can be measured through a two-step titration 4 with 0.5 N sulfuric acid. In the first step, sulfuric acid reacts with remaining potassium hydroxide and aluminum complex. The reaction with aluminum complex forms precipitate of aluminum hydroxide.

$2KOH(aq)+H_2SO_4(aq)\rightarrow K_2SO_4(aq)+2H_2O(l)$

In the second step, first, excess amount of sodium fluoride was added. It reacted with the precipitate to form soluble complex $AlF_6^{3-}$. Then, the titration was continued.

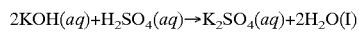
$Al(OH)_3(s)+6NaF(aq)\rightarrow AlF_6^{3-}+3NaOH+3Na^+$ $2NaOH(aq)+H_2SO_4(aq)\rightarrow Na_2SO_4(aq)+2H_2O(l)$ The Al-Tex concentration and dissolved aluminum (i.e. in the complex form of Al($OH)_4^-$) concentration in the test sample can be calculated by the following equations:

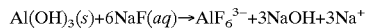
Al-Tex concentration (by volume)=$(A-B/3)\times 2.25\%$

Dissolved aluminum (oz/gal)=$0.0597\times B$ where A and B are the volumes, in the unit of mL, of sulfuric acid consumed in the first step and in the second step respectively.

The detailed titration procedure is as follows: 1) Pipette 10 mL cooled sample of chemical bath into a 150-mL Erienmeyer flask; 2) Add 50 mL distilled water; 3) Add two drops of phenolphthalein indicator to obtain a pink color; 4) Titrate with 0.5 N sulfuric acid to a clear endpoint and record mL of acid used as titration "A"; 5) Add one gram of sodium fluoride (the sample returns to a pink color); 6) Continue to titrate it with 0.5 N sulfuric acid (do not refill the burette) to a clear endpoint that persists for 20 seconds. Subtract "A" from total mL of acid used and record the difference as "B".

The etch rate can be measured by the weight difference of testing coupons through the following equation:

$$\text{Etch Rate}\{\mu m/\min\} = \frac{10{,}000\,\{\mu m/cm\}(W_1\{g\} - W_2\{g\})}{\rho\{g/cm^3\} \cdot A\{cm^2\} \cdot t\{\min\}}$$

where $W_1$ and $W_2$ are the weights of a coupon before and after UF processing, A is the coupon surface area (e.g., a square coupon has a surface area $2L^2$, where L is the length of the square), t is UF processing time (i.e. 30 min), p is the density of aluminum (i.e. 2.7 g/cm 3), and 10,000 is a unit conversion factor. An averaged etch rate of two test coupons was reported each time.

Microscopy analysis was also performed. Surface finishes of raw coupons and of coupons after UF process were observed by optical microscope (Ram Optical Instrumentation) with composite video signal at 250 magnification.

Figure 10A:
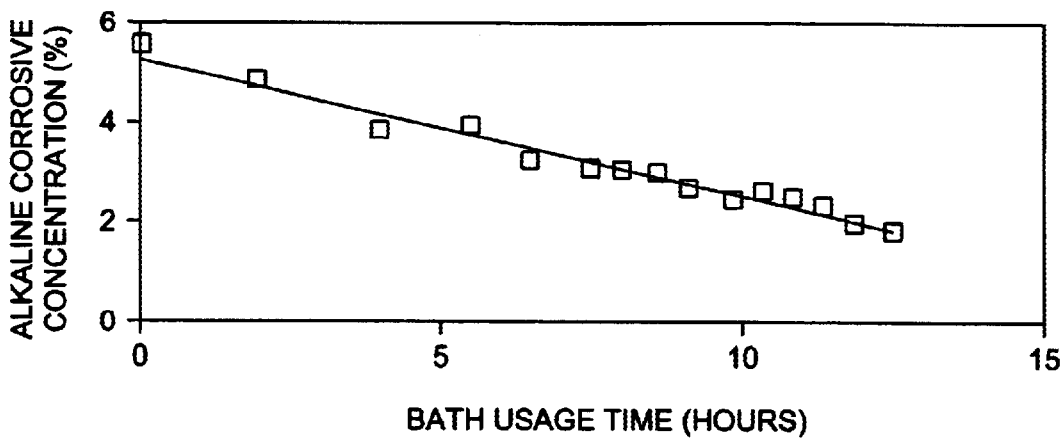
FIGS. 10A through 10C show the changes of (a) alkaline corrosive (e.g., Al-Tex™ solution) concentration, (b) dissolved aluminum concentration, and (c) etch rate, respectively.
Figure 10B:
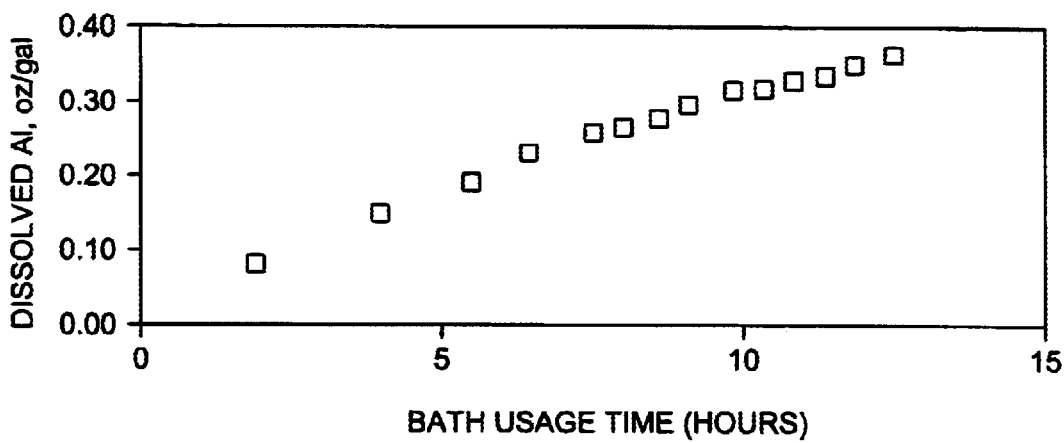
Figure 10C:
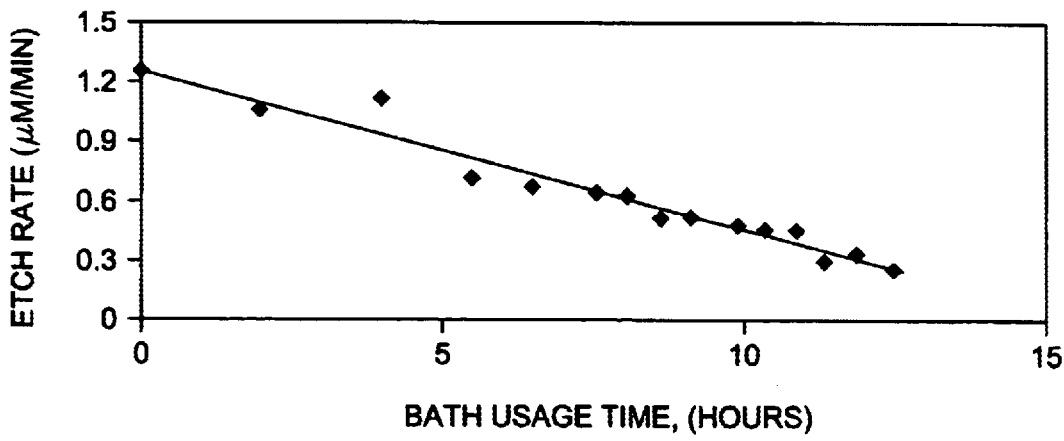

The change of the chemical bath can be readily followed by changes in alkaline corrosive (i.e., Al-Tex™ in this example) concentration, dissolved aluminum concentration, and etch rate as shown in FIGS. 10A through 10C, respectively. The initial Al-Tex 102™ concentration as measured by titration was 5.5%. FIG. 10A shows a nearly linear drop of Al-Tex concentration as the bath usage time accumulates. In the meantime, dissolved aluminum concentration rises monotonically (FIG. 10B). After 13.5 hours of continuous processing of the loadlock, it lost 2.3 lb, which is 3.4% of weight reduction. As more Al-Tex (corrosive material) is consumed, corrosion rate drops almost linearly with the bath usage time (FIG. 10C).

Figure 11:
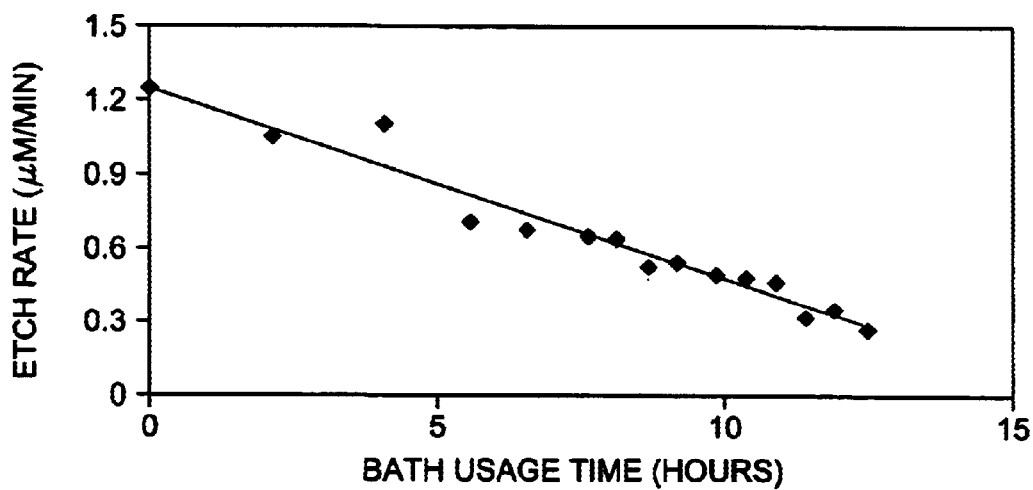
FIG. 11 shows the etch rate on test coupon surfaces at different bath usage times.
Figure 12:
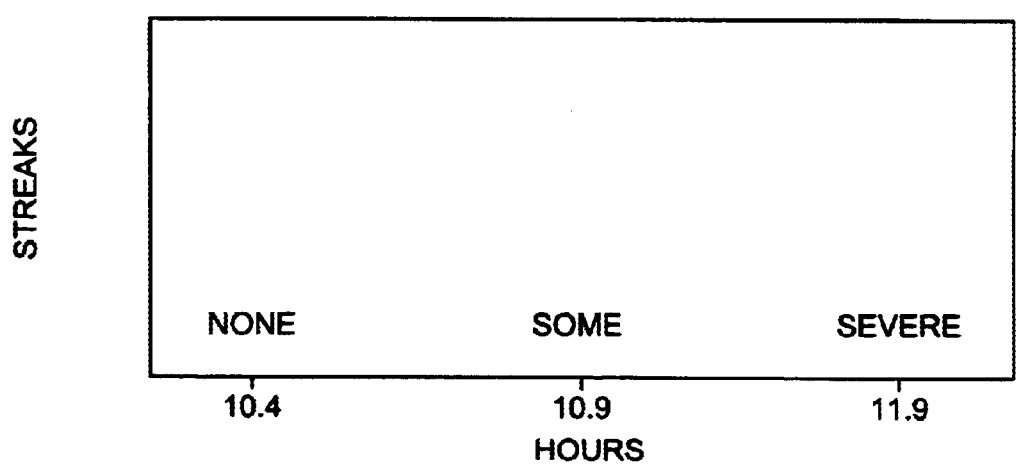
FIG. 12 shows the relative amount of scratches on test coupon surfaces at different bath usage times.

In turn, the ability of the bath to effectively finish an article degrades as the bath life increases. FIG. 11 shows the etch rate on test coupon surfaces—each finished for about 30 minutes in baths with different usage times. Under the tested conditions, it was apparent that up to nine hours of bath usage was acceptable for achieving a suitable random matte finish through UF processing of the present invention. Conversely, at 12.5 hours, there were still scratches remaining from the original machine finish, indicating insufficient etching. A closer look (FIG. 12) from nine hours to 12.5 hours shows that there are no scratches formed at 10.4 hours, some scratches at 10.9 hours, and severe scratches at 11.9 hours. Because the existence of scratches affects sealability, the time after which scratches appear—10.4 hours here— could be considered as the effective bath lifetime for this example.

Figure 13:
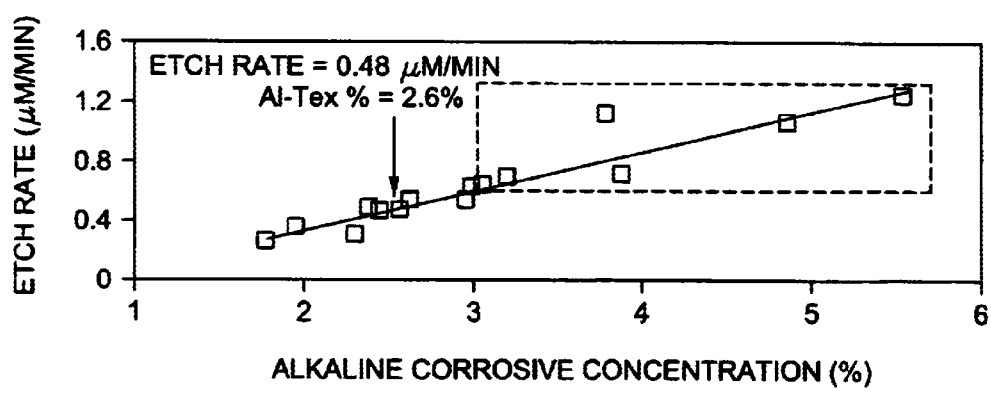
FIG. 13 shows the correlation between etch rate and Al-Tex concentration for the example of FIG. 10. The arrow indicates the least acceptable point of the chemical bath and the box shows the working envelope.

A more generic relation to evaluate the chemical bath is how etch rate changes as Al-Tex concentration drops. This relation should not change even though it takes different bath usage times to reach the same Al-Tex concentration when Aluminum loading varies. As shown in FIG. 13, it appears that etch rate drops linearly as Al-Tex concentration decreases. This indicates that the reaction between Aluminum and potassium hydroxide is a first-order kinetic reaction, i.e. the rate of etching Aluminum is proportional to the potassium hydroxide concentration, or indirectly Al-Tex concentration. The linear relation of etch rate as a function of Al-Tex concentration can be useful to manage processing time to achieve the same finishing result even as bath life increases. In other words, when Al-Tex concentration becomes low, a longer processing time (i.e., longer than 30 min) may be required to achieve the same surface finish.

Figure 14:
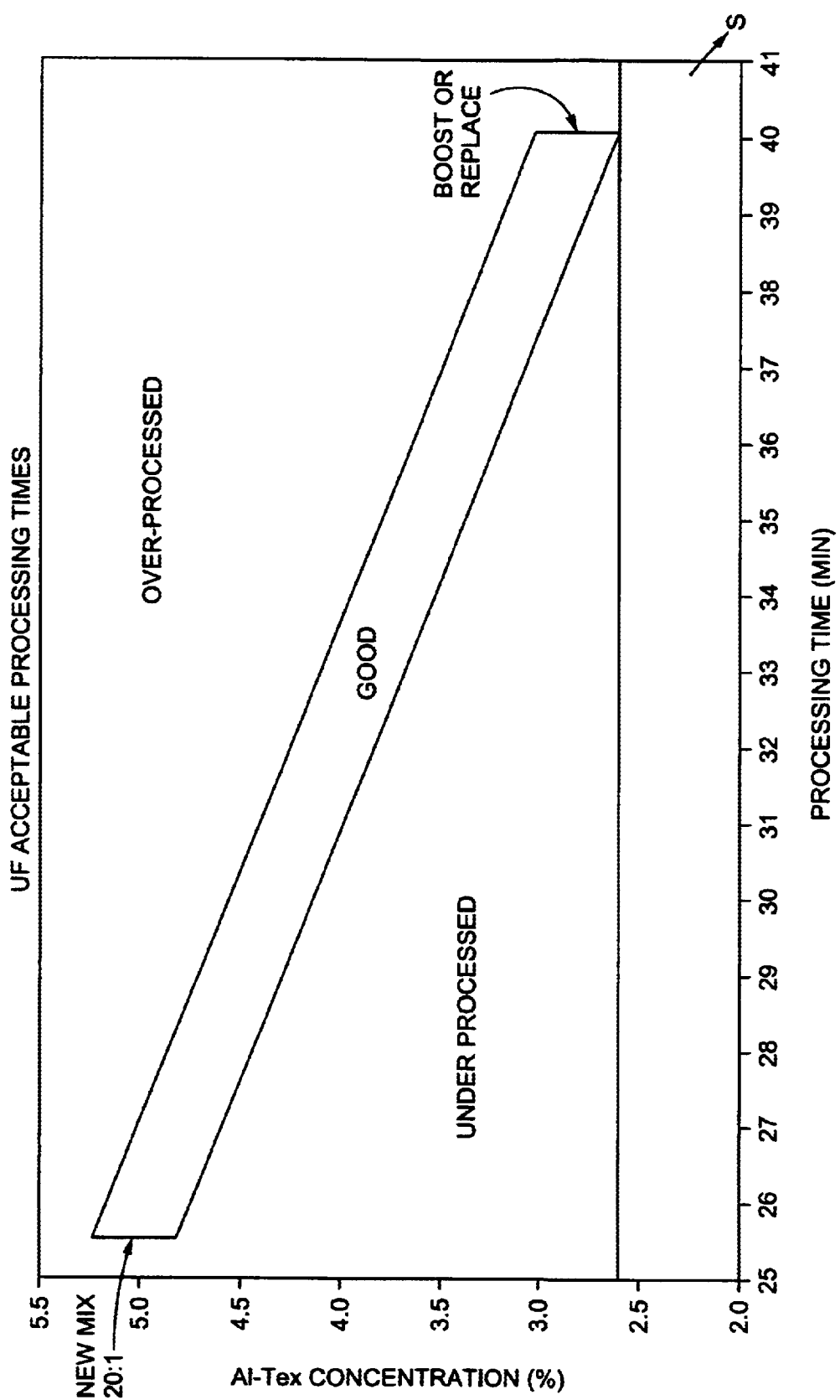
FIG. 14 is a graph showing the relationship between Al-Tex concentration and processing time.
Figure 15:
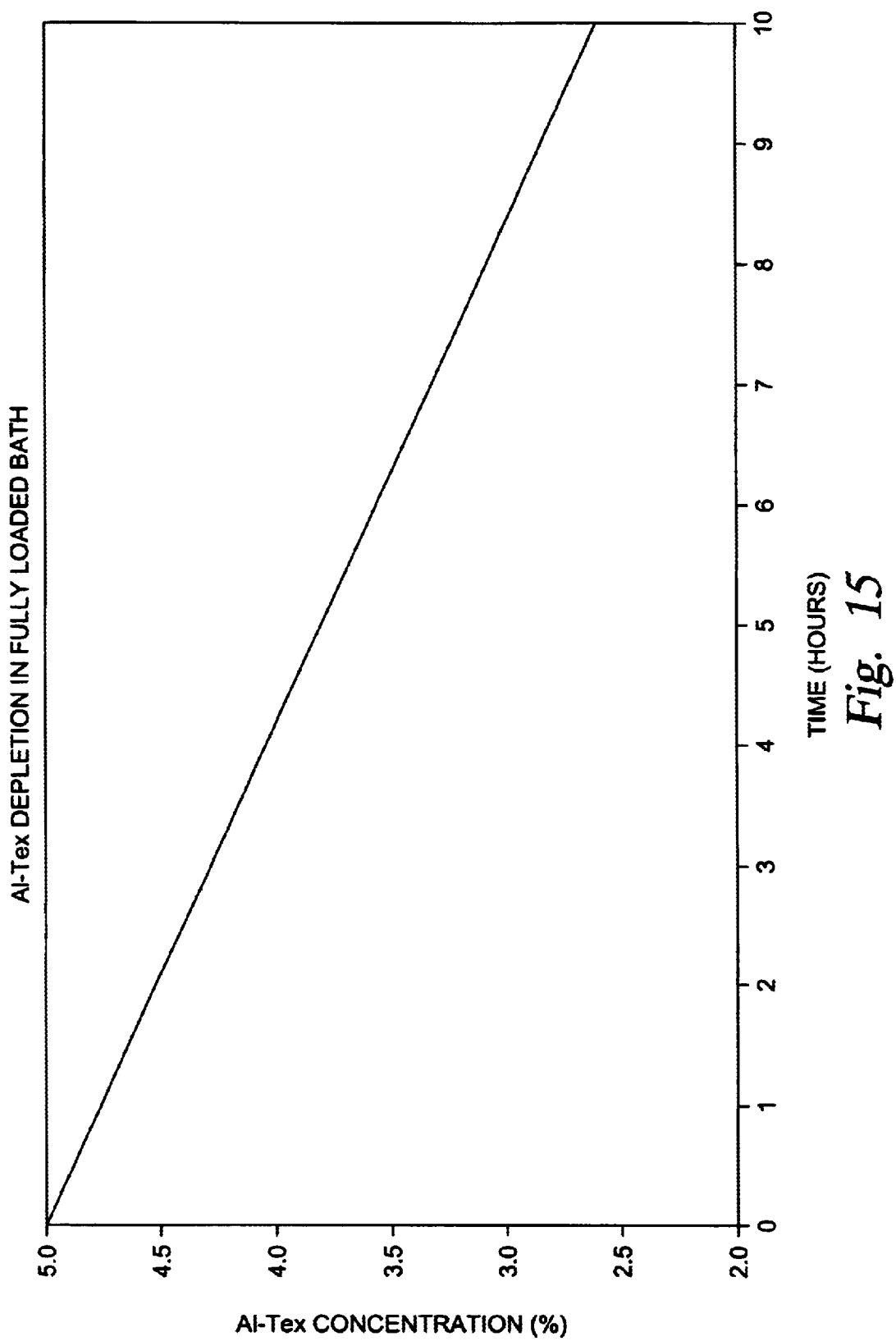
FIG. 15 is a graph show Al-Tex depletion over time.
Figure 16:
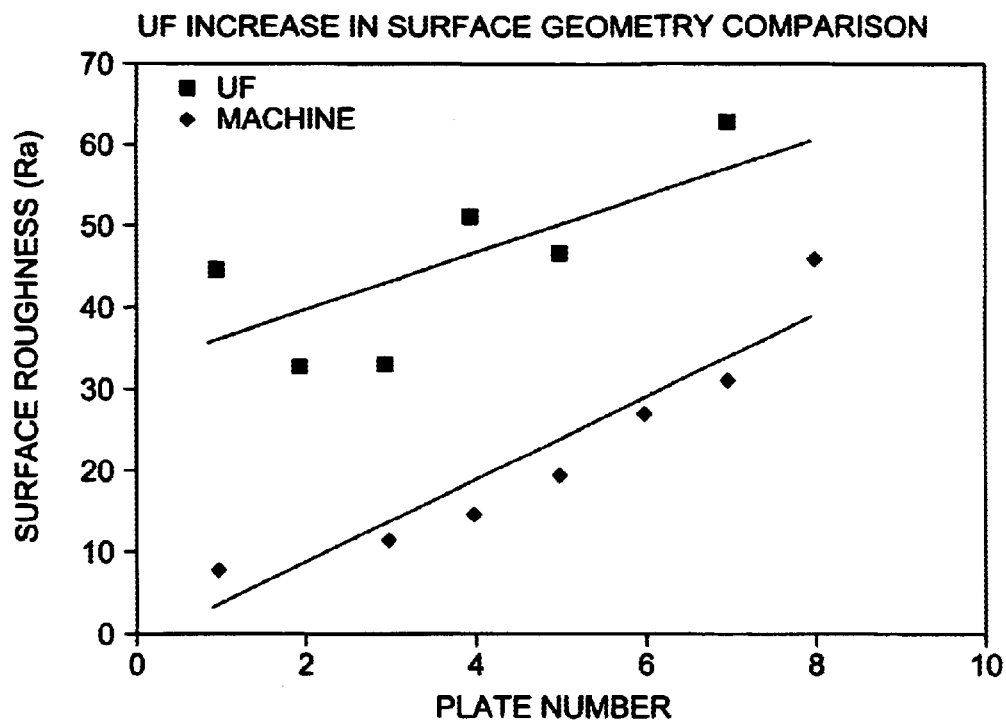
FIG. 16 is a graph showing the surface roughness of UF plates.

The point correspondent to 10.4 hours is also shown in FIG. 13. This is taken as the least acceptable point of the chemical bath. At this point, Al-Tex concentration is 2.6%, and the etch rate is 0.48 μm/min. To run UF process in a safer condition, a working envelope of the chemical bath is taken to be at Al-Tex concentration higher than 3% and etch rate higher than 0.6 μm/min. The working envelope is shown as a box in FIG. 13. Along these lines, FIG. 14 shows an empirically derived operating curve for processing aluminum articles in Al-Tex 102 finishing bath. This curve depicts processing times as a function of Al-Tex concentration to achieve finished articles with desired, randomly micro-pitted surfaces suitable for sealing applications. FIG. 16 shows the rate of Al-Tex depletion over time as articles are being processed.

EXAMPLE 2

This example addresses sealing aspects of articles finished using a UF process of the present invention. Because the UF etching can actually increase the surface roughness, general consensus would have presumed that UF processed sealing surfaces would more readily leak. However, not only did leaking not increase, but also the UF process reduced known leaking surfaces. This technique, therefore, no longer requires masking or selectively etching sealing surfaces, thus increasing the robust nature of the process and at the same time, decreasing the cost.

In this test, flat plate 6000 series aluminum test articles were used. Standard industry high power ultrasonic transducers operating at 25 Khz were used for finishing the aluminum article plates. Various chemicals (e.g., caustic potassium hydroxide) known to etch aluminum were combined with additives for controlling foaming and smutting to produce the near final bath parameters.

In order to test sealability, the flat plates were mounted to a small vacuum chamber. Prior to being finished, the plates were machined with a combination of three lay patterns, linear, random and as-machined, and three roughnesses of 8, 16 and 32 [Ra] for a total of 9 sample finishes. The sealing test verified a no-leak scenario. The vacuum environment tested at <1 [mTorr] with a leak detection of >10−9 [cc atm] conditions. Each plate was first tested as machined, UF processed, then re-tested. Once UF processed all 9 plates and 2 vacuum chambers sealed in all configurations. Note: one plate leaked consistently before UF processing and sealed in all configurations after processing reiterating the robust sealing nature of the process.

Two sets of 26 coupons machined in equal numbers to 16 and 32 [Ra] surface geometry (roughness) were used as samples prior to UF processing. These were subsequently reviewed making comparisons to the geometry after finishing. Non-contact profilometry (WYCO) was used as the measurement device. Additionally it was important not only to set the ideal process operating parameters, but also to determine how robust the process would be in an actual production environment.

The results established that the significant parameters were chemical concentration, bath temperature and processing time. An effective combination of these parameters involved a chemical (Al-Tex) concentration of 5%, temperature of 50° C., time of 30 minutes and ultrasonic power density of at least 10 W/gal. Although a minimal effect, pre-processed surface roughness relates linearly to the resulting surface roughness as seen in FIG. 16.

Figure 17:
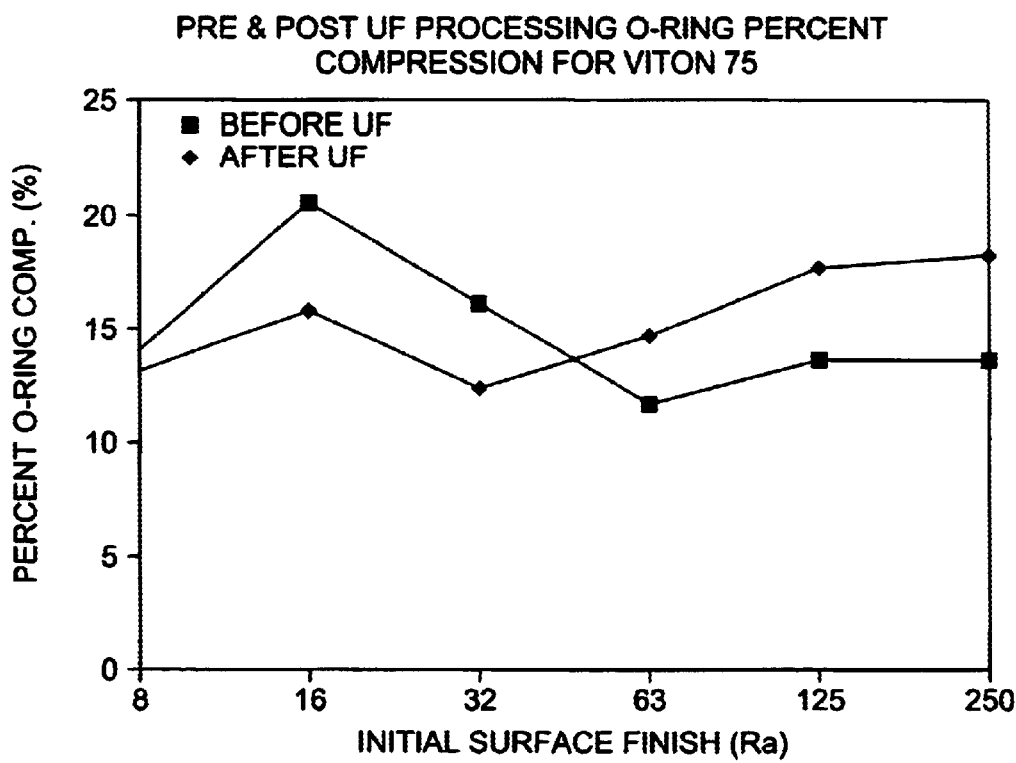
FIG. 17 is graph showing pre and post UF O-ring compression of plates having different initial surface roughnesses.

Expanded seal testing was also performed. The expanded tests included plates with 63, 125 and 250 [Ra] finishes vacuum tested while varying O-ring compression ratios until leak detection occurred. These results, added to the initial results, demonstrated that smoother pre-processed surfaces were beneficial to sealing at or below a 32 [Ra] value as seen in FIG. 17. Identical tests were later expanded to show (FIG.

Figure 18:
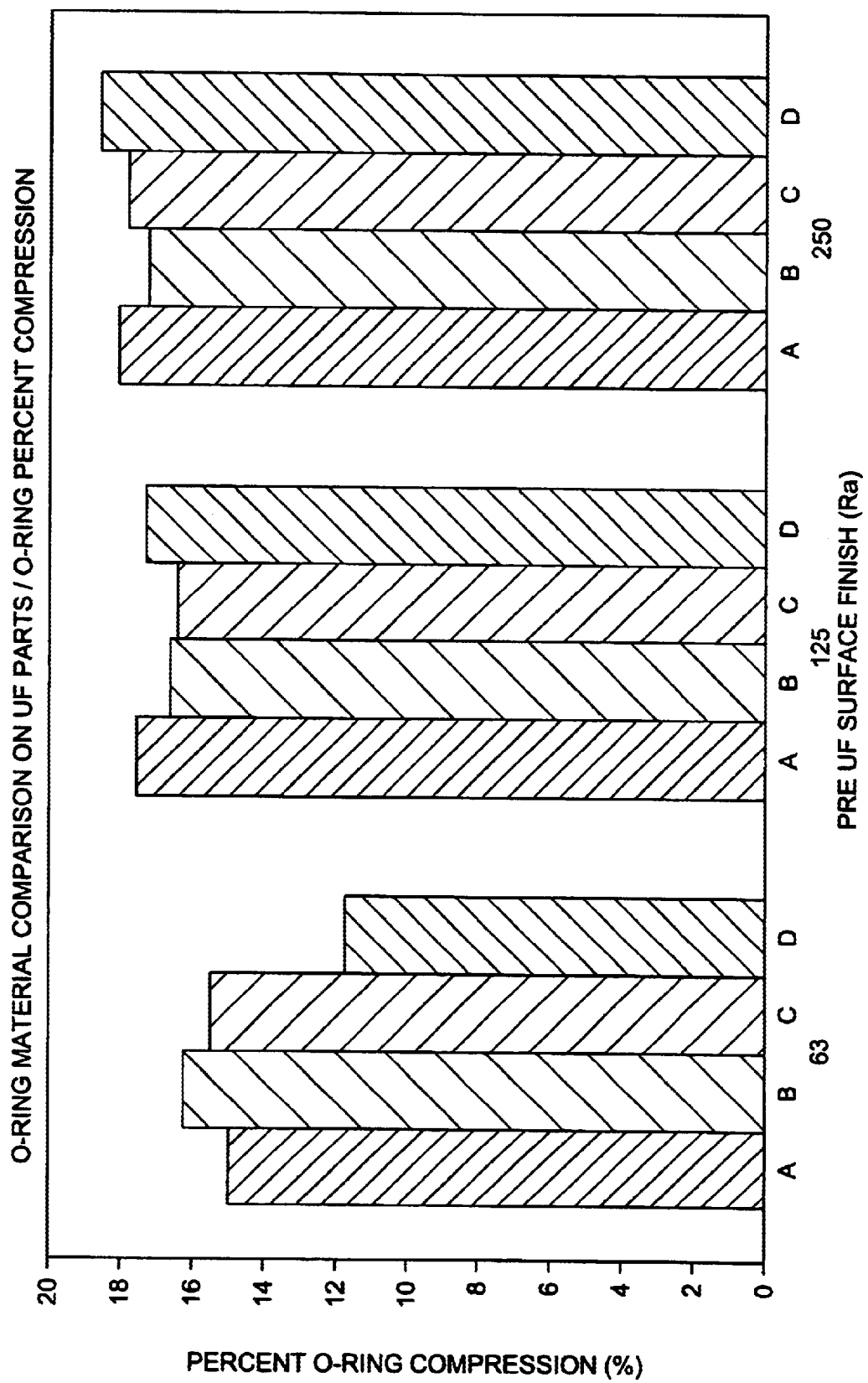
FIG. 18 is a chart showing the O-ring compression of different O-rings on surfaces of different roughnesses.

18) that common O-ring materials had virtually identical sealing characteristics to UF surfaces. The bar graph of FIG. 18 shows sealing for the following O-ring types: Viton 75™ (A), Kalrez 4079™ (B), Kalrez 2037™ (C), and Chemraz 513™ (D).

Testing continued on actual parts known to leak. These tests on more than 50 parts verified the assumption first found in the initial sealing tests, that UF processing refurbishes leaking surfaces. Further study also revealed that existing rework techniques were acceptable both before and after UF processing.

Results from prototype testing typically consisted of reworking existing parts with physical characteristics that may be affected by UF processing. This includes interaction with installed hardware, more specific removal rate tests and UF qualification for non-static seals. For hardware, UF causes little, if any, damage for such typical hardware inserts as stainless steels threads (i.e. Heli-coils, Keenserts) and dowel pins. Additional material removal rate tests confirmed that diameters were decreased by approximately 0.00025 [in] per side. Preliminary wear on semi-dynamic seals (continually opening and closing a static seal) indicated similar wear and particulate creation to currently processed parts.

Finally, cleanliness, out-gassing and ion chromatography testing was also performed. The initial micro-inspections studied the morphology with stereomicroscope, SEM and EDS equipment. These apparatus showed noticeable amounts of undesirable iron, silicon and other inclusions. Fortunately, conventional UHV chamber cleaning that is used in the semiconductor industry can follow UF, if necessary, for removing these inclusions.

Out-gassing and ion chromatography tests followed with excellent results. The UF process did not cause ionic concentrations to exceed establish limits. Furthermore, the test pieces outgassed approximately $0.10$–$0.15 \times 10^{12}$ [molecules/cm$^2$], over half the total mass loss (TML) of $0.32 \times 10^{12}$ [molecules/cm$^2$] as established by industry standards.

EXAMPLE 3

Comparative testing was done on a 200 mm conventionally finished (i.e., jitterbug/polish) loadlock door and an ultrasonically finished loadlock door to determine whether particles could be generated from wear between the loadlock door and the o-ring in the loadlock chamber. The ultrasonic finish gives a rougher surface but rounds the edges that are seen with the standard door finish. The question was whether this rougher, but more stable surface has more potential to generate particles than the standard finished door. Each door was run for fifty cycles, with particles monitored every ten cycles. A cycle consisted of closing the door, pumping down the loadlock, venting the loadlock, then opening the door. Particles added were monitored on six evenly spaced wafers loaded in a 25-slot wafer cassette. The wafers were pre scanned for base particle count, then the cassette was placed in the loadlock as if wafers were being loaded for process. Then the loadlock door was put through its set of cycles. The cassette was removed and the wafers were post scanned for number of particles added. Results showed 0.035 particles >0.12 microns added per cycle with the conventionally finished door. There were 0.019 particles added per cycle with the ultrasonically finished door. For particles >0.16 microns both doors displayed equivalent results of 0.01 particles added per cycle. This data suggests that the ultrasonic finish does not generate any more particles than the conventionally finished door.

Other Embodiments

It should be understood that various changes, substitutions and alterations can be made herein without departing from the spirit and scope of the invention as defined by the appended claims. For example, while the disclosure describes ultrasonic finishing as a way of achieving a randomly distributed, micro-pitted surface, it should be recognized that any suitable finishing process may be used to achieve the sealable, micro pitted surface of the present invention. For example, in addition to ultrasonic finishing, particle (media) blasting and chemical etching are suitable processes for achieving the desired surface finish. Particle blasting could include but would not be limited to sugar, starch, and walnut pit particle blasting. One benefit of using such materials is that they can be easily and inexpensively removed from the finished article. Chemical etching may also be used to achieve a desired sealable surface. One example of an etching process for acquiring randomly distributed micro pits is taught in U.S. Pat. No. 5,091,046 to Hunter et al., which is hereby incorporated by reference into this specification.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A sealable apparatus comprising:
   (a) a seal device having first and second sealing surface regions;
   (b) a first component having a seal contact area for receiving the seal device at the first sealing surface region; and
   (c) a second component having a seal contact area for receiving the seal device at the second sealing surface region, wherein the second component's seal contact area comprises a metallic surface with randomly distributed micro-pits capable of sealably mating with the second sealing surface region, wherein the first and second components seal to one another when the first and second contact areas are operably mated to the seal device at its first and second sealing surface regions.

2. The sealable apparatus of claim 1, wherein the seal device is a gasket.

3. The apparatus of claim 2, wherein the gasket is an elastomer O-ring.

4. The apparatus of claim 2, wherein the first sealing surface region is a first side of the gasket, and the second sealing surface region is a second side of the gasket.

5. The apparatus of claim 1, wherein the second seal contact area is composed of aluminum that has been finished to have a sufficient plurality of randomly distributed micro-pits for said surface to sealably mate with the second sealing surface region of the seal device.

6. The apparatus of claim 5, wherein the aluminum seal contact area results from an ultrasonic finishing process to acquire the randomly distributed micro-pits.

7. The apparatus of claim 5, wherein the aluminum seal contact area results from a chemical etching process for acquiring the randomly distributed micro-pits.

8. The apparatus of claim 1, wherein the second component is an aluminum article.

9. The apparatus of claim 8, wherein the metal article has a groove for receiving the seal device, the groove including the second component's seal contact area for receiving the first sealing surface region of the seal device.

10. A sealable apparatus comprising:
(a) a seal device; and
(b) a component having a seal contact area for receiving the seal device, wherein the seal contact area comprises a metallic surface with randomly distributed micro-pits capable of sealably mating with the seal device when the seal contact area is operably mated to the seal device.

11. The sealable apparatus of claim 10, wherein the seal device is a gasket.

12. The apparatus of claim 11, wherein the gasket is an O-ring.

13. The apparatus of claim 11, wherein the gasket sealably mates with the component at a first side of the gasket.

14. The apparatus of claim 10, wherein the seal contact area is composed of aluminum that has been finished to have a sufficient plurality of randomly distributed micro-pits for sealably mating with the seal device.

15. The apparatus of claim 14, wherein the aluminum seal contact area results from an ultrasonic finishing process to acquire the randomly distributed micro-pits.

16. The apparatus of claim 14, wherein the aluminum seal contact area results from a chemical etching process for acquiring the randomly distributed micro-pits.

17. The apparatus of claim 10, wherein the component is an aluminum article.

18. The apparatus of claim 17, wherein the metal article has a groove for receiving the seal device, the groove including the seal contact area for receiving the seal device.

19. A vacuum chamber apparatus comprising:
(a) a seal device;
(b) a chamber housing; and
(c) a base with a groove for receiving the seal device, the groove having a metallic seal contact area comprising a plurality of randomly distributed micro-pits that make the contact area being capable of sealably mating to the seal device, the chamber housing being capable of sealably mounting to the base through the seal device.

20. The apparatus of claim 19, wherein the groove defines an interior vacuum surface of the base, the vacuum surface being within the chamber housing when it is mounted to the base, said groove and vacuum surface comprising aluminum having a plurality of randomly distributed micro-pits, wherein the groove is suitable for sealably mating with the chamber housing through the seal device, and the vacuum surface absorbs a sufficiently low enough amount of gas for operably inhibiting virtual leaking when a vacuum is created within the chamber housing when the chamber housing is mounted to the base.

* * * * *